United States Patent
Lee et al.

(10) Patent No.: US 11,502,649 B2
(45) Date of Patent: Nov. 15, 2022

(54) HIGH-LINEARITY DIFFERENTIAL TO SINGLE ENDED BUFFER AMPLIFIER

(71) Applicant: MEDIATEK INC., Hsinchu (TW)

(72) Inventors: Fong-Wen Lee, Hsinchu (TW); Yu-Hsin Lin, Hsinchu (TW)

(73) Assignee: MEDIATEK INC., Hsinchu (TW)

( * ) Notice: Subject to any disclaimer, the term of this patent is extended or adjusted under 35 U.S.C. 154(b) by 0 days.

(21) Appl. No.: 17/184,805

(22) Filed: Feb. 25, 2021

(65) Prior Publication Data

US 2021/0328554 A1 Oct. 21, 2021

Related U.S. Application Data

(60) Provisional application No. 63/010,713, filed on Apr. 16, 2020.

(51) Int. Cl.
*H03F 1/32* (2006.01)
*H03F 3/45* (2006.01)

(52) U.S. Cl.
CPC ....... *H03F 1/3211* (2013.01); *H03F 3/45076* (2013.01); *H03F 3/45479* (2013.01); *H03F 2203/45151* (2013.01)

(58) Field of Classification Search
CPC ............... H03F 1/3211; H03F 3/45076; H03F 3/45479; H03F 2203/45151; H03F 1/26; H03F 3/45928; H03F 3/45941; H03F 2203/45136; H03F 2203/45528; H03F 2203/45586; H03F 2203/45594; H03F 2203/45604; H03F 3/45475; H03F 3/45; H03F 1/34

USPC ............................................ 330/69, 252–261
See application file for complete search history.

(56) References Cited

U.S. PATENT DOCUMENTS

| | | |
|---|---|---|
| 3,761,831 A | 9/1973 | Foerster |
| 4,758,796 A | 7/1988 | Verhoeven et al. |
| 5,432,476 A | 7/1995 | Tram |
| 5,760,648 A * | 6/1998 | Koifman ............. H03F 3/45479 330/69 |

OTHER PUBLICATIONS

European Search Report dated Aug. 17, 2021, issued in application No. EP 21165919.8.

(Continued)

*Primary Examiner* — Hieu P Nguyen
(74) *Attorney, Agent, or Firm* — McClure, Qualey & Rodack, LLP

(57) ABSTRACT

A differential to single-ended buffer amplifier with a swing suppression resistor in the differential amplification architecture is shown. The differential to single-ended buffer amplifier has a positive input terminal, a negative input terminal, a differential to single-ended operational amplifier (DISO op amp), and a swing suppression resistor. The DISO op amp has a non-inverting input terminal and an inverting input terminal respectively coupled to the positive input terminal and the negative input terminal, and it has a single-ended output terminal that outputs the output signal of the differential to single-ended buffer amplifier. The swing suppression resistor is connected between the negative input terminal of the differential to single-ended buffer amplifier and the non-inverting input terminal of the DISO op amp.

11 Claims, 3 Drawing Sheets

(56) References Cited

OTHER PUBLICATIONS

Losmandy, B. J.; "Operational Amplifier Applications for Audio Systems;" Journal of the Audio Engineering Society; Apr. 1968; pp. 14-21.
Chinese language office action dated Nov. 2, 2021, issued in application No. TW 110113754.

* cited by examiner

HIGH-LINEARITY DIFFERENTIAL TO SINGLE ENDED BUFFER AMPLIFIER

CROSS REFERENCE TO RELATED APPLICATIONS

This application claims the benefit of U.S. Provisional Application No. 63/010,713 filed on Apr. 16, 2020, the entirety of which is incorporated by reference herein.

BACKGROUND OF THE INVENTION

Field of the Invention

The present invention relates to buffer amplifiers in a differential amplification architecture.

Description of the Related Art

A buffer amplifier (sometimes simply called a buffer) is one that provides electrical impedance transformation from one circuit to another, with the aim of preventing the signal source from being affected by the loading current.

In some applications, the loading apparatus should be driven by a single-ended signal. A differential to single-ended buffer amplifier is required.

FIG. 1 depicts a differential to single-ended buffer amplifier 100 implemented by a fully differential (differential-in differential-out) operational amplifier 102. Only the positive output of the fully differential operational amplifier 102 is coupled to the loading apparatus as the output Vout of the differential to single-ended buffer amplifier 100. In such architecture, an additional common-mode feedback circuit CMFB is required to suppress common-mode noise. The common-mode noise may be generated in the wires and cables, due to electromagnetic induction, etc. Current flowing into the ground of a circuit from another circuit may result in a ground potential rise, which is another source of common-mode noise.

FIG. 2 depicts another differential to single-ended buffer amplifier 200, which is implemented by a differential to single-ended operational amplifier 202, and is a differential amplifier that amplifies a voltage difference, (Vin_p−Vin_n), between the positive and negative input terminals of the differential to single-ended buffer amplifier 200. The common-mode noise superimposed on both the positive and negative input terminals is therefore suppressed. In such architecture, no additional common-mode feedback circuit, such as CMFB of FIG. 1, is required. However, there is a significant signal swing at the non-inverting input terminal (Vx+) of the differential to single-ended operational amplifier 202, which degrades the linearity of the differential to single-ended buffer amplifier 200.

BRIEF SUMMARY OF THE INVENTION

A high-linearity differential to single-ended buffer amplifier is proposed in the present invention.

A differential to single-ended buffer amplifier in accordance with an exemplary embodiment of the present invention has a positive input terminal, a negative input terminal, a differential to single-ended operational amplifier, and a swing suppression resistor. The differential to single-ended operational amplifier has a non-inverting input terminal and an inverting input terminal respectively coupled to the positive input terminal and the negative input terminal, and it has a single-ended output terminal that outputs the output signal of the differential to single-ended buffer amplifier. The swing suppression resistor is coupled between the negative input terminal of the differential to single-ended buffer amplifier and the non-inverting input terminal of the differential to single-ended operational amplifier. Accordingly, a signal swing at the non-inverting input terminal of the differential to single-ended operational amplifier is suppressed, wherein the signal swing is caused by a vibration of a differential part of an input signal of the differential to single-ended buffer amplifier.

In an exemplary embodiment, the differential to single-ended buffer amplifier further comprises a first resistor coupled between the positive input terminal of the differential to single-ended buffer amplifier and the non-inverting input terminal of the differential to single-ended operational amplifier. The resistance of the swing suppression resistor depends on the resistance of the first resistor.

In an exemplary embodiment, the first resistor and the swing suppression resistor have the same resistance, and so that the signal swing at the non-inverting input terminal of the differential to single-ended operational amplifier due to vibration of a differential part of an input signal of the differential to single-ended buffer amplifier can be completely eliminated.

In an exemplary embodiment, the differential to single-ended buffer amplifier further comprises a second resistor coupling the non-inverting input terminal of the differential to single-ended operational amplifier to ground. Resistance of the second resistor is n times the resistance of the first resistor. The gain of the differential to single-ended buffer amplifier is G. The value n depends on the gain G for common-mode noise suppression.

In an exemplary embodiment, the value n is half of G.

In an exemplary embodiment, the gain is between the output signal and the input signal of the differential to single-ended buffer amplifier. The output signal is the voltage at the single-ended output terminal of the differential to single-ended operational amplifier. The input signal is the voltage difference between the positive input terminal and the negative input terminal of the differential to single-ended buffer amplifier.

In an exemplary embodiment, the differential to single-ended buffer amplifier further comprises a third resistor and a fourth resistor. The third resistor is coupled between the negative input terminal of the differential to single-ended buffer amplifier and the inverting input terminal of the differential to single-ended operational amplifier. The fourth resistor is coupled between the inverting input terminal of the differential to single-ended operational amplifier and the single-ended output terminal of the differential to single-ended operational amplifier.

In an exemplary embodiment, the first resistor and the third resistor have the same resistance.

In an exemplary embodiment, the resistance of the fourth resistor is twice the resistance of the third resistor.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is made for the purpose of illustrating the general principles of the invention and should not be taken in a limiting sense. The scope of the invention is best determined by reference to the appended claims.

Figure 1:
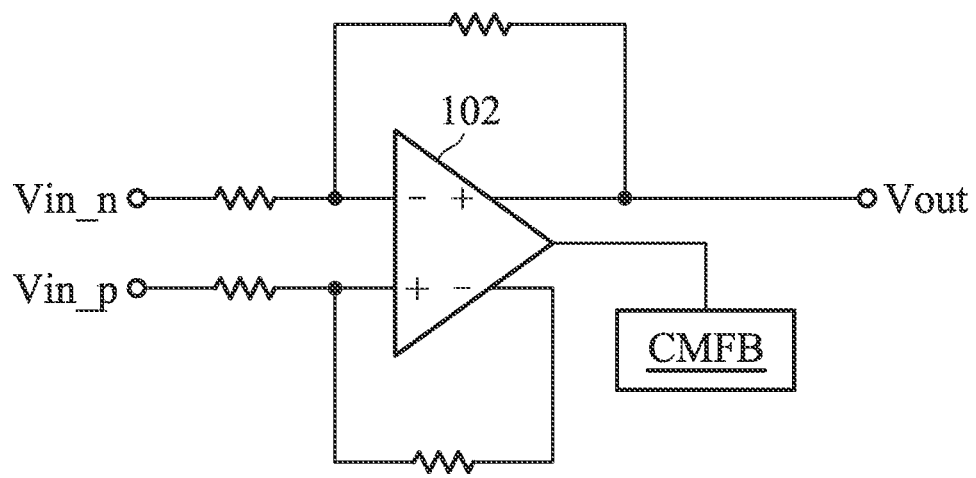
FIG. 1 depicts a differential to single-ended buffer amplifier 100 implemented by a fully differential (differential-in differential-out) operational amplifier 102.
Figure 2:
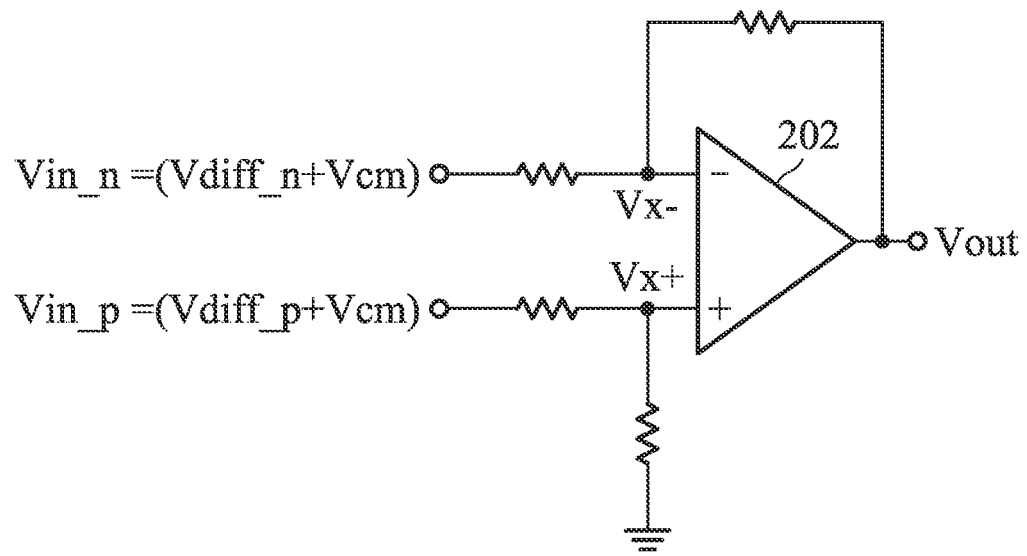
FIG. 2 depicts another differential to single-ended buffer amplifier 200, which is implemented by a differential to single-ended operational amplifier 202.
Figure 3:
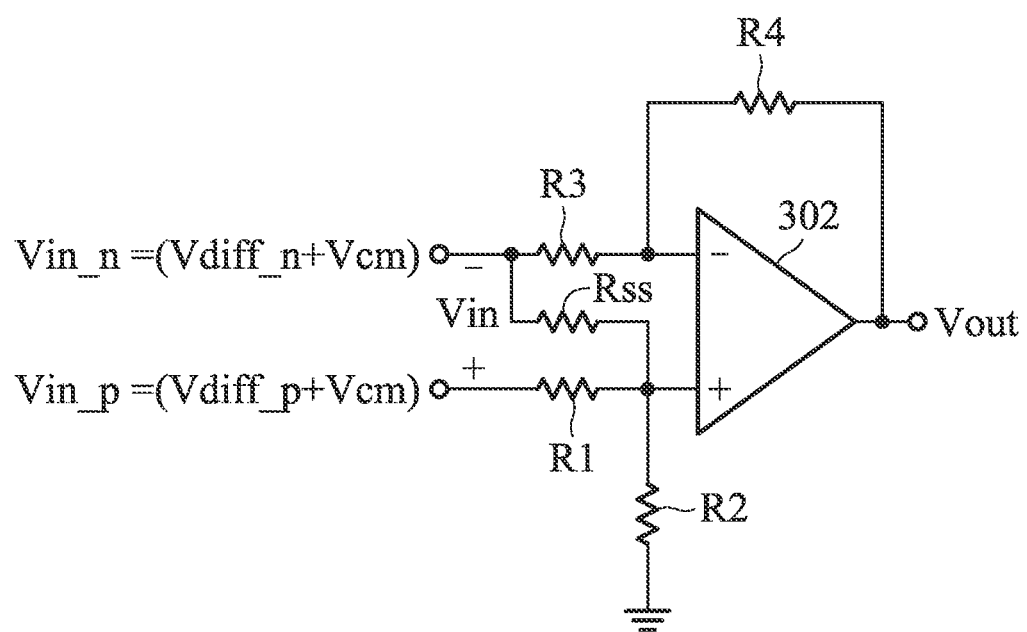
FIG. 3 depicts a differential to single-ended buffer amplifier 300 in accordance with an exemplary embodiment of the present invention, which includes a positive input terminal Vin_p, a negative input terminal Vin_n, a differential to single-ended operational amplifier (DISO op amp) 302, and a swing suppression resistor Rss.

FIG. 3 depicts a differential to single-ended buffer amplifier 300 in accordance with an exemplary embodiment of the present invention, which includes a positive input terminal Vin_p, a negative input terminal Vin_n, a differential to single-ended operational amplifier (DISO op amp) 302, and a swing suppression resistor Rss.

The DISO op amp 302 has a non-inverting input terminal "+" and an inverting input terminal "−" coupled to the positive input terminal Vin_p (receiving a positive differential input Vdiff_p and a common-mode voltage Vcm) and negative input terminal Vin_n (receiving a negative differential input Vdiff_n and the common-mode voltage Vcm) of the differential to single-ended buffer amplifier 300, respectively, and has a single-ended output terminal outputting an output signal Vout of the differential to single-ended buffer amplifier 300.

The swing suppression resistor Rss is coupled between the negative input terminal Vin_n of the differential to single-ended buffer amplifier 300 and the non-inverting input terminal "+" of the DISO op amp 302.

By the swing suppression resistor Rss, a signal swing at the non-inverting input terminal "+" of the DISO op amp 302 due to vibration of a differential part (e.g., Vdiff_p and Vdiff_n) of an input signal Vin of the differential to single-ended buffer amplifier 300 is suppressed.

As shown, the differential to single-ended buffer amplifier 300 further comprises a first resistor R1 coupled between the positive input terminal Vin_p of the differential to single-ended buffer amplifier 300 and the non-inverting input terminal "+" of the DISO op amp 302. The resistance of the swing suppression resistor Rss depends on the resistance of the first resistor R1. In this architecture, the first signal swing portion at the non-inverting input terminal "+" due to the positive differential input Vdiff_p transferred through R1 may be compensated for by the second signal swing portion due to negative differential input Vdiff_n transferred through Rss.

In an exemplary embodiment, the first resistor R1 and the swing suppression resistor Rss have the same resistance, e.g., Rss=R1. Thus, the signal swing at the non-inverting input terminal of the differential to single-ended operational amplifier due to vibration of a differential part of an input signal of the differential to single-ended buffer amplifier can be completely eliminated.

FIG. 3 shows that the differential to single-ended buffer amplifier 300 further comprises a second resistor R2 coupling the non-inverting input terminal "+" of the DISO op amp 302 to ground. The resistance of the second resistor R2 is n times the resistance of the first resistor R1, e.g., R2=n*R1. The gain of the differential to single-ended buffer amplifier 300 is G. The value n depends on the gain G for common-mode noise suppression.

In an exemplary embodiment, the value n is half of G, e.g., n=G/2.

As shown in FIG. 3, the gain G is between the output signal Vout and the input signal Vin of the differential to single-ended buffer amplifier 300, e.g., G=Vout/Vin. The output signal Vout is the voltage at the single-ended output terminal of the DISO op amp 302. The input signal Vin is the voltage difference between the positive input terminal Vin_p and the negative input terminal Vin_n of the differential to single-ended buffer amplifier 300.

FIG. 3 shows that the differential to single-ended buffer amplifier 300 further comprises a third resistor R3 and a fourth resistor R4. The third resistor R3 is coupled between the negative input terminal Vin_n of the differential to single-ended buffer amplifier 300 and the inverting input terminal "−" of the DISO op amp 302. The fourth resistor R4 is coupled between the inverting input terminal "−" of the DISO op amp 302 and the single-ended output terminal of the DISO op amp 302.

In an exemplary embodiment, the first resistor R1 and the third resistor R3 have the same resistance, e.g., R1=R3.

In an exemplary embodiment, the resistance of the fourth resistor R4 may be twice the resistance of the third resistor R3, e.g., R4=2*R3.

In an exemplary embodiment wherein R1=R3=Rss and $$R2 = n*R1 = \frac{G}{2}*R1,$$

the common-mode noise Vcm_noise (noise in the common mode voltage Vcm) is successfully suppressed to 0

$$\left(\text{because if } n \text{ is } \frac{G}{2}, \text{Vcm\_noise}*\frac{2n}{1+2n}*(1+G) - \text{Vcm\_noise}*G \text{ is } 0\right)$$

by the differential to single-ended buffer amplifier 300.

The differential to single-ended buffer amplifier 300 successfully suppresses the common-mode noise as well as the non-ideal signal swing at the non-inverting input terminal of the DISO op amp 302. A high linearity buffer amplifier is provided.

The differential to single-ended buffer amplifier 300 is in a differential amplification architecture that suppresses the common-mode noise Vcm_noise by amplifying the input voltage difference, (Vin_p−Vin_n). There are many variants of the differential amplification architecture. The swing suppression resistor Rss may be applied to all kinds of differential amplification architecture.

Any differential to single-ended buffer amplifier with the swing suppression resistor Rss should be considered within the scope of the present invention.

The forgoing resistors can be any resistance elements mentioned.

The forgoing differential to single-ended operational amplifier is different from a fully-differential operational amplifier.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A differential to single-ended buffer amplifier, comprising:
   a positive input terminal and a negative input terminal;
   a differential to single-ended operational amplifier, having a non-inverting input terminal and an inverting input terminal coupled to the positive input terminal and negative input terminal of the differential to single-ended buffer amplifier, respectively, and having a single-ended output terminal outputting an output signal of the differential to single-ended buffer amplifier;
   a swing suppression resistor, coupled between the negative input terminal of the differential to single-ended buffer amplifier and the non-inverting input terminal of the differential to single-ended operational amplifier, and thereby a signal swing at the non-inverting input terminal of the differential to single-ended operational amplifier is suppressed, wherein the signal swing is caused by a vibration of a differential part of an input signal of the differential to single-ended buffer amplifier;
   a first resistor, coupled between the positive input terminal of the differential to single-ended buffer amplifier and the non-inverting input terminal of the differential to single-ended operational amplifier; and
   a third resistor, coupled between the negative input terminal of the differential to single-ended buffer amplifier and the inverting input terminal of the differential to single-ended operational amplifier, wherein the third resistor and the first resistor have the same resistance.

2. The differential to single-ended buffer amplifier as claimed in claim 1,
   wherein resistance of the swing suppression resistor depends on resistance of the first resistor.

3. The differential to single-ended buffer amplifier as claimed in claim 2, wherein the first resistor and the swing suppression resistor have the same resistance.

4. The differential to single-ended buffer amplifier as claimed in claim 3, further comprising:
   a second resistor, coupling the non-inverting input terminal of the differential to single-ended operational amplifier to ground; and
   resistance of the second resistor is n times the resistance of the first resistor;
   a gain of the differential to single-ended buffer amplifier is G; and
   n depends on G for common-mode noise suppression.

5. The differential to single-ended buffer amplifier as claimed in claim 4, wherein:
   n is half of G.

6. The differential to single-ended buffer amplifier as claimed in claim 5, wherein:
   the gain is between the output signal and the input signal of the differential to single-ended buffer amplifier;
   the output signal is a voltage at the single-ended output terminal of the differential to single-ended operational amplifier; and
   the input signal is a voltage difference between the positive input terminal and the negative input terminal of the differential to single-ended buffer amplifier.

7. The differential to single-ended buffer amplifier as claimed in claim 6, further comprising:
   a fourth resistor, coupled between the inverting input terminal of the differential to single-ended operational amplifier and the single-ended output terminal of the differential to single-ended operational amplifier.

8. The differential to single-ended buffer amplifier as claimed in claim 7, wherein:
   resistance of the fourth resistor is twice that of the third resistor.

9. The differential to single-ended buffer amplifier as claimed in claim 2, further comprising:
   a second resistor, coupling the non-inverting input terminal of the differential to single-ended operational amplifier to ground; and
   resistance of the second resistor is n times the resistance of the first resistor;
   gain of the differential to single-ended buffer amplifier is G; and
   n depends on G for common-mode noise suppression.

10. The differential to single-ended buffer amplifier as claimed in claim 9, wherein:
    the gain is between the output signal and the input signal of the differential to single-ended buffer amplifier;
    the output signal is a voltage at the single-ended output terminal of the differential to single-ended operational amplifier; and
    the input signal is a voltage difference between the positive input terminal and the negative input terminal of the differential to single-ended buffer amplifier.

11. The differential to single-ended buffer amplifier as claimed in claim 10, further comprising:
    a fourth resistor, coupled between the inverting input terminal of the differential to single-ended operational amplifier and the single-ended output terminal of the differential to single-ended operational amplifier.

* * * * *